US009411668B2

(12) United States Patent
Banerjee et al.

(10) Patent No.: US 9,411,668 B2
(45) Date of Patent: Aug. 9, 2016

(54) APPROACH TO PREDICTIVE VERIFICATION OF WRITE INTEGRITY IN A MEMORY DRIVER

(71) Applicant: NVIDIA CORPORATION, Santa Clara, CA (US)

(72) Inventors: Arijit Banerjee, Charlottesville, VA (US); Mahmut Ersin Sinangil, Westford, MA (US); John W. Poulton, Chapel Hill, NC (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 14/154,655

(22) Filed: Jan. 14, 2014

(65) Prior Publication Data

US 2015/0199223 A1    Jul. 16, 2015

(51) Int. Cl.
*G06F 11/07* (2006.01)
(52) U.S. Cl.
CPC .......... *G06F 11/076* (2013.01); *G06F 11/0793* (2013.01)
(58) Field of Classification Search
CPC .............. G06F 11/079; G06F 11/2236; G06F 11/2257; G06F 11/008; G06F 17/5045; G06F 17/5081; G11C 29/02; G11C 29/42; G11C 29/44; G11C 29/4401; G11C 29/50
See application file for complete search history.

(56) References Cited

U.S. PATENT DOCUMENTS

| | | | | |
|---|---|---|---|---|
| 4,615,030 A * | 9/1986 | Kumagai | ....................... 714/824 |
| 7,768,830 B2 * | 8/2010 | Shibata | .............. G11C 11/5642 365/185.03 |
| 8,365,118 B2 * | 1/2013 | Joshi et al. | ..................... 716/111 |
| 8,595,593 B2 * | 11/2013 | Joo | ..................... G06F 11/1048 714/6.24 |
| 9,009,571 B2 * | 4/2015 | Liu | ..................... G06F 11/1048 714/773 |
| 2008/0046778 A1 * | 2/2008 | Yoshida | .............. G06F 11/1068 714/5.1 |
| 2014/0059268 A1 * | 2/2014 | Adachi | ................... G06F 12/00 711/102 |

* cited by examiner

*Primary Examiner* — Nadeem Iqbal
(74) *Attorney, Agent, or Firm* — Artegis Law Group, LLP

(57) ABSTRACT

A subsystem is configured to apply an offset voltage to a test, or canary, SRAM write driver circuit to create a condition that induces failure of the write operation. The offset voltage is incrementally increased until failure of the test write operation occurs in the canary SRAM circuit. The subsystem then calculates a probability of failure for the actual, non-test SRAM write operation, which is performed by an equivalent driver circuit with zero offset. The subsystem then compares the result to a benchmark acceptable probability figure. If the calculated probability of failure is greater than the benchmark acceptable probability figure, corrective action is initiated. In this manner, actual failures of SRAM write operations are anticipated, and corrective action reduces their occurrence and their impact on system performance.

20 Claims, 6 Drawing Sheets

APPROACH TO PREDICTIVE VERIFICATION OF WRITE INTEGRITY IN A MEMORY DRIVER

BACKGROUND OF THE INVENTION

1. Field of the Invention

Embodiments of the present invention relate generally to computer architecture and, more specifically, to an approach to predictive verification of write integrity in a memory driver.

2. Description of the Related Art

In computer systems, generally, and in graphics processing units (GPUs), in particular, there is widespread utilization of static random access memory (SRAM) circuits. A conventional SRAM cell consists of two inverters connected front to back. Specifically, the output of the first inverter is connected to the input of the second inverter, and the output of the second inverter is connected to the input the first inverter. The output of one inverter represents a data bit, while the output of the complementary inverter represents the inverse of the data bit. To change the logic state (i.e. write a new value to the SRAM cell), a memory driver circuit overdrives one of the outputs to the opposite state. The overdrive action causes the driven inverter to change state, and the complementary inverter subsequently changes state to achieve the opposite logic state of both inverters.

Each inverter includes a pair of field effect transistors (FETs). One P-channel FET (PFET) is connected to a supply voltage, and one N-channel FET (NFET) is connected to ground. The mid-points of both FETs are connected together. This arrangement is termed a complementary-metal-oxide-semiconductor (CMOS) circuit. The high level is derived from the upper PFET that connects the supply voltage to the output while the lower NFET is gated off. In conventional systems, changing the state of the stored data is accomplished by driving the output of the inverter that is at the high level to the low level. In order to drive the output of the inverter to ground, the memory driver overpowers the upper PFET of the CMOS pair that forms the inverter. Therefore, the write driver that overdrives the inverter must be strong enough to pull the high level output below the NFET threshold of the driven inverter, even though the P-channel device is trying to pull the output up. The strength, or current sinking capacity, of an integrated FET is proportional to the area of the device. Hence, NFETs with the capability to overdrive an integrated PFET must have proportionally large area.

The NFETs applied in memory driver circuits are designed to have adequate capability to overdrive the inverters in the memory cells. In the actual circuits, a number of factors may conspire to cause a memory write operation to fail due to inability to achieve the necessary overdrive. These factors include process variations, temperature effects, degradation of supply voltage level, and aging effects. Thus, consideration of write failures is an important aspect of design with respect to system performance and reliability.

Assist circuits may be employed to help to minimize the possibility of write failures. In one instance of an assist circuit, the local supply voltage to the SRAM cell is driven to a lower level than the system supply voltage. This creates a larger margin for the driver, reducing the likelihood of failure. In another instance of an assist circuit, one of the bit-line voltages to the SRAM cell is driven to below ground as opposed to ground level. This again creates a larger margin for the driver, and again reduces the likelihood of failure.

One drawback associated with assist circuits is that such circuits incur an energy-per-access overhead. Further, in typical implementations, assist circuits are in continuous use. Finally, failures are detected only after occurring in active memory cells. That is, actual system failure must occur before corrective action can be implemented. If the system includes error correction capability, the system activates correction upon detection of errors. This incurs additional system cycles and, so, degrades system performance.

As the foregoing illustrates, what is needed in the art is a more effective technique for reducing the occurrence of SRAM write failures.

SUMMARY OF THE INVENTION

One embodiment of the present invention sets forth a computer-implemented method for predicting failures in a plurality of memory modules, including configuring a first memory module with a first voltage differential between complimentary inverters, performing a first write operation to write first data to the first memory module, determining that the first write operation has failed, in response to determining that the first write operation has failed, computing a first failure probability associated with a second memory module based on the first voltage differential, determining that the first failure probability exceeds a threshold value, and applying a corrective action to the second memory module.

One advantage of the disclosed approach is that a subsystem may anticipate when memory access failures are likely to occur and then initiate corrective action before actual failures occur. Further, the subsystem is configured to gate off assist circuits when assist circuit utility is not required, thereby reducing power usage.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

System Overview

Figure 1:
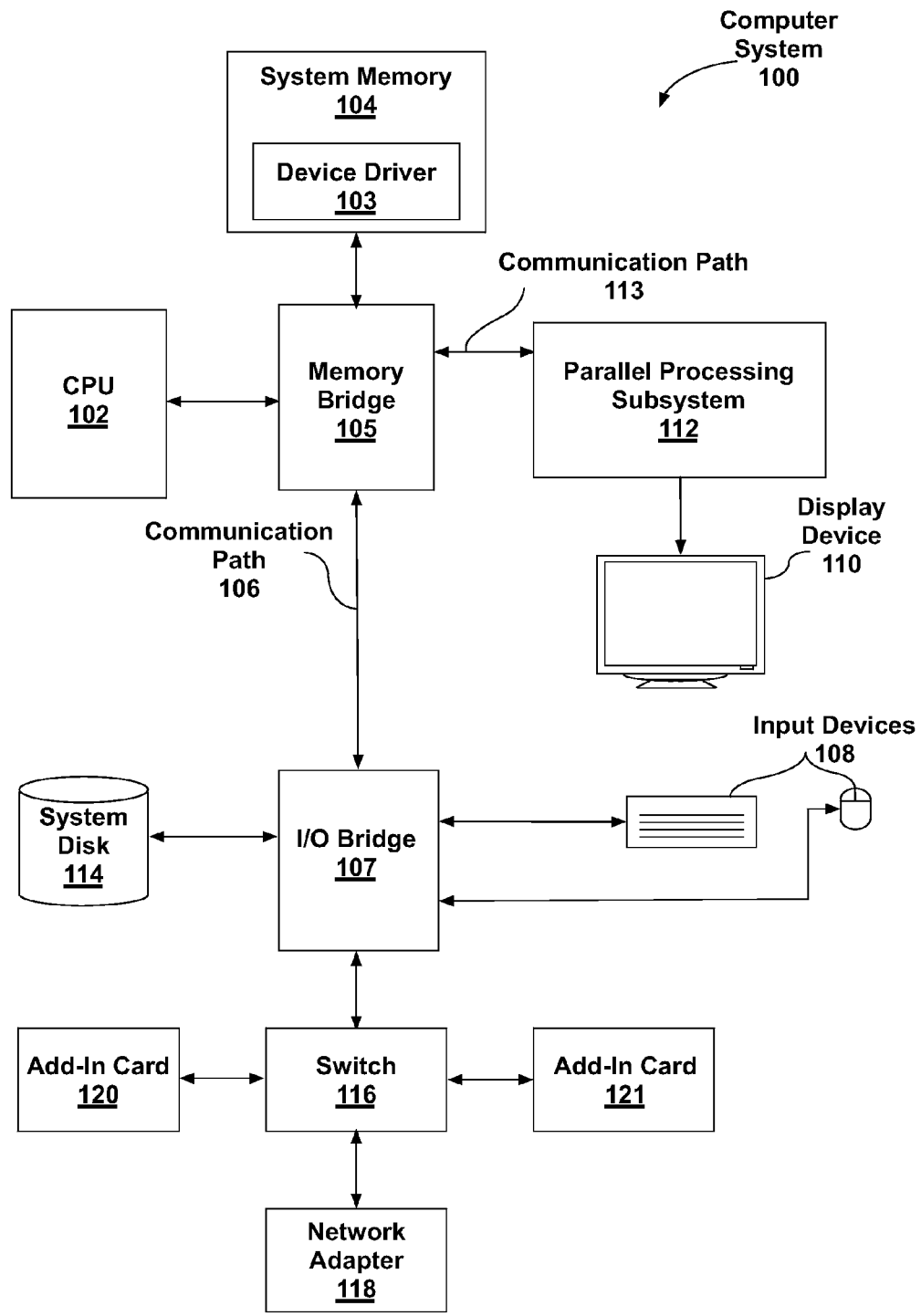
FIG. 1 is a block diagram illustrating a computer system configured to implement one or more aspects of the present invention.

FIG. 1 is a block diagram illustrating a computer system 100 configured to implement one or more aspects of the present invention. As shown, computer system 100 includes, without limitation, a central processing unit (CPU) 102 and a system memory 104 coupled to a parallel processing subsystem 112 via a memory bridge 105 and a communication path 113. Memory bridge 105 is further coupled to an I/O (input/output) bridge 107 via a communication path 106, and I/O bridge 107 is, in turn, coupled to a switch 116.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, or the like. In such embodiments, the parallel processing subsystem 112 incorporates circuitry optimized for graphics and video processing, including, for example, video output circuitry. As described in greater detail below in FIG. 2, such circuitry may be incorporated across one or more parallel processing units (PPUs) included within parallel processing subsystem 112. In other embodiments, the parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more of the other elements of FIG. 1 to form a single system. For example, parallel processing subsystem 112 may be integrated with CPU 102 and other connection circuitry on a single chip to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

Figure 2:
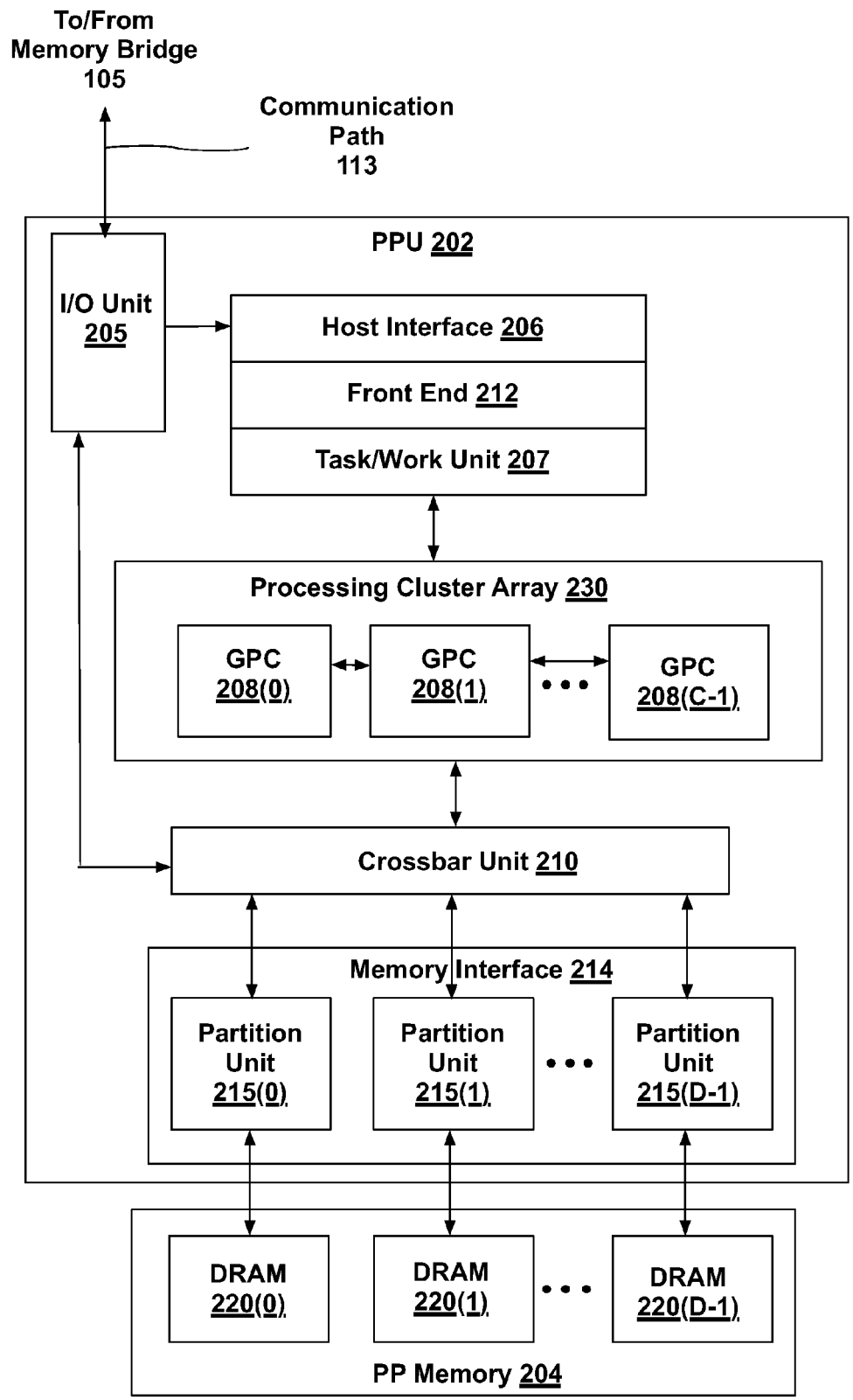
FIG. 2 is a block diagram of a parallel processing unit included in the parallel processing subsystem of FIG. 1, according to one embodiment of the present invention.

FIG. 2 is a block diagram of a parallel processing unit (PPU) 202 included in the parallel processing subsystem 112 of FIG. 1, according to one embodiment of the present invention. Although FIG. 2 depicts one PPU 202, as indicated above, parallel processing subsystem 112 may include any number of PPUs 202. As shown, PPU 202 is coupled to a local parallel processing (PP) memory 204. PPU 202 and PP memory 204 may be implemented using one or more integrated circuit devices, such as programmable processors, application specific integrated circuits (ASICs), or memory devices, or in any other technically feasible fashion.

In some embodiments, PPU 202 comprises a graphics processing unit (GPU) that may be configured to implement a graphics rendering pipeline to perform various operations related to generating pixel data based on graphics data supplied by CPU 102 and/or system memory 104. When processing graphics data, PP memory 204 can be used as graphics memory that stores one or more conventional frame buffers and, if needed, one or more other render targets as well. Among other things, PP memory 204 may be used to store and update pixel data and deliver final pixel data or display frames to display device 110 for display. In some embodiments, PPU 202 also may be configured for general-purpose processing and compute operations.

In operation, CPU 102 is the master processor of computer system 100, controlling and coordinating operations of other system components. In particular, CPU 102 issues commands that control the operation of PPU 202. In some embodiments, CPU 102 writes a stream of commands for PPU 202 to a data structure (not explicitly shown in either FIG. 1 or FIG. 2) that may be located in system memory 104, PP memory 204, or another storage location accessible to both CPU 102 and PPU 202. A pointer to the data structure is written to a pushbuffer to initiate processing of the stream of commands in the data structure. The PPU 202 reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

As also shown, PPU 202 includes an I/O (input/output) unit 205 that communicates with the rest of computer system 100 via the communication path 113 and memory bridge 105. I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to PP memory 204) may be directed to a crossbar unit 210. Host interface 206 reads each pushbuffer and transmits the command stream stored in the pushbuffer to a front end 212.

As mentioned above in conjunction with FIG. 1, the connection of PPU 202 to the rest of computer system 100 may be varied. In some embodiments, parallel processing subsystem 112, which includes at least one PPU 202, is implemented as an add-in card that can be inserted into an expansion slot of computer system 100. In other embodiments, PPU 202 can be integrated on a single chip with a bus bridge, such as memory bridge 105 or I/O bridge 107. Again, in still other embodiments, some or all of the elements of PPU 202 may be included along with CPU 102 in a single integrated circuit or system on chip (SoC).

In operation, front end 212 transmits processing tasks received from host interface 206 to a work distribution unit (not shown) within task/work unit 207. The work distribution unit receives pointers to processing tasks that are encoded as task metadata (TMD) and stored in memory. The pointers to TMDs are included in a command stream that is stored as a pushbuffer and received by the front end unit 212 from the host interface 206. Processing tasks that may be encoded as TMDs include indices associated with the data to be processed as well as state parameters and commands that define how the data is to be processed. For example, the state parameters and commands could define the program to be executed on the data. The task/work unit 207 receives tasks from the front end 212 and ensures that GPCs 208 are configured to a valid state before the processing task specified by each one of the TMDs is initiated. A priority may be specified for each TMD that is used to schedule the execution of the processing task. Processing tasks also may be received from the processing cluster array 230. Optionally, the TMD may include a parameter that controls whether the TMD is added to the head or the tail of a list of processing tasks (or to a list of pointers to the processing tasks), thereby providing another level of control over execution priority.

PPU 202 advantageously implements a highly parallel processing architecture based on a processing cluster array 230 that includes a set of C general processing clusters (GPCs) 208, where C≥1. Each GPC 208 is capable of executing a large number (e.g., hundreds or thousands) of threads concurrently, where each thread is an instance of a program. In various applications, different GPCs 208 may be allocated for processing different types of programs or for performing different types of computations. The allocation of GPCs 208 may vary depending on the workload arising for each type of program or computation.

Memory interface 214 includes a set of D of partition units 215, where D≥1. Each partition unit 215 is coupled to one or more dynamic random access memories (DRAMs) 220 residing within PPM memory 204. In one embodiment, the number of partition units 215 equals the number of DRAMs 220, and each partition unit 215 is coupled to a different DRAM 220. In other embodiments, the number of partition units 215 may be different than the number of DRAMs 220. Persons of ordinary skill in the art will appreciate that a DRAM 220 may be replaced with any other technically suitable storage device. In operation, various render targets, such as texture maps and frame buffers, may be stored across DRAMs 220, allowing partition units 215 to write portions of each render target in parallel to efficiently use the available bandwidth of PP memory 204.

A given GPC 208 may process data to be written to any of the DRAMs 220 within PP memory 204. Crossbar unit 210 is configured to route the output of each GPC 208 to the input of any partition unit 215 or to any other GPC 208 for further processing. GPCs 208 communicate with memory interface 214 via crossbar unit 210 to read from or write to various DRAMs 220. In one embodiment, crossbar unit 210 has a connection to I/O unit 205, in addition to a connection to PP memory 204 via memory interface 214, thereby enabling the processing cores within the different GPCs 208 to communicate with system memory 104 or other memory not local to PPU 202. In the embodiment of FIG. 2, crossbar unit 210 is directly connected with I/O unit 205. In various embodiments, crossbar unit 210 may use virtual channels to separate traffic streams between the GPCs 208 and partition units 215.

Again, GPCs 208 can be programmed to execute processing tasks relating to a wide variety of applications, including, without limitation, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel/fragment shader programs), general compute operations, etc. In operation, PPU 202 is configured to transfer data from system memory 104 and/or PP memory 204 to one or more on-chip memory units, process the data, and write result data back to system memory 104 and/or PP memory 204. The result data may then be accessed by other system components, including CPU 102, another PPU 202 within parallel processing subsystem 112, or another parallel processing subsystem 112 within computer system 100.

As noted above, any number of PPUs 202 may be included in a parallel processing subsystem 112. For example, multiple PPUs 202 may be provided on a single add-in card, or multiple add-in cards may be connected to communication path 113, or one or more of PPUs 202 may be integrated into a bridge chip. PPUs 202 in a multi-PPU system may be identical to or different from one another. For example, different PPUs 202 might have different numbers of processing cores and/or different amounts of PP memory 204. In implementations where multiple PPUs 202 are present, those PPUs may be operated in parallel to process data at a higher throughput than is possible with a single PPU 202. Systems incorporating one or more PPUs 202 may be implemented in a variety of configurations and form factors, including, without limitation, desktops, laptops, handheld personal computers or other handheld devices, servers, workstations, game consoles, embedded systems, and the like.

Figure 3:
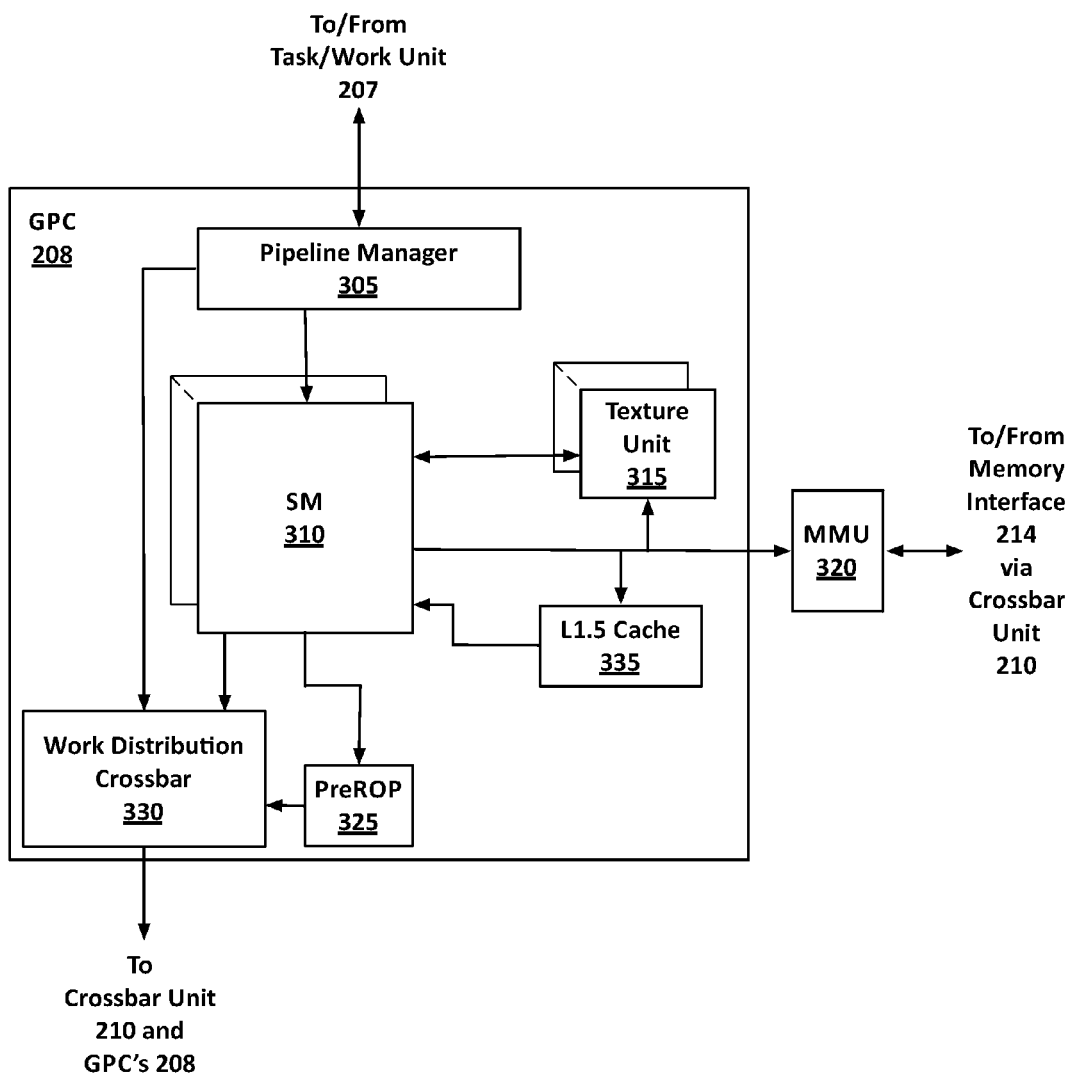
FIG. 3 is a block diagram of a general processing cluster included in the parallel processing unit of FIG. 2, according to one embodiment of the present invention.

FIG. 3 is a block diagram of a GPC 208 included in PPU 202 of FIG. 2, according to one embodiment of the present invention. In operation, GPC 208 may be configured to execute a large number of threads in parallel to perform graphics, general processing and/or compute operations. As used herein, a "thread" refers to an instance of a particular program executing on a particular set of input data. In some embodiments, single-instruction, multiple-data (SIMD) instruction issue techniques are used to support parallel execution of a large number of threads without providing multiple independent instruction units. In other embodiments, single-instruction, multiple-thread (SIMT) techniques are used to support parallel execution of a large number of generally synchronized threads, using a common instruction unit configured to issue instructions to a set of processing engines within GPC 208. Unlike a SIMD execution regime, where all processing engines typically execute identical instructions, SIMT execution allows different threads to more readily follow divergent execution paths through a given program. Persons of ordinary skill in the art will understand that a SIMD processing regime represents a functional subset of a SIMT processing regime.

Operation of GPC 208 is controlled via a pipeline manager 305 that distributes processing tasks received from a work distribution unit (not shown) within task/work unit 207 to one or more streaming multiprocessors (SMs) 310. Pipeline manager 305 may also be configured to control a work distribution crossbar 330 by specifying destinations for processed data output by SMs 310.

In one embodiment, GPC 208 includes a set of M of SMs 310, where M≥1. Also, each SM 310 includes a set of functional execution units (not shown), such as execution units and load-store units. Processing operations specific to any of the functional execution units may be pipelined, which enables a new instruction to be issued for execution before a previous instruction has completed execution. Any combination of functional execution units within a given SM 310 may be provided. In various embodiments, the functional execution units may be configured to support a variety of different operations including integer and floating point arithmetic (e.g., addition and multiplication), comparison operations, Boolean operations (AND, OR, XOR), bit-shifting, and computation of various algebraic functions (e.g., planar interpolation and trigonometric, exponential, and logarithmic functions, etc.). Advantageously, the same functional execution unit can be configured to perform different operations.

In operation, each SM 310 is configured to process one or more thread groups. As used herein, a "thread group" or "warp" refers to a group of threads concurrently executing the same program on different input data, with one thread of the group being assigned to a different execution unit within an SM 310. A thread group may include fewer threads than the number of execution units within the SM 310, in which case some of the execution may be idle during cycles when that thread group is being processed. A thread group may also include more threads than the number of execution units within the SM 310, in which case processing may occur over consecutive clock cycles. Since each SM 310 can support up to G thread groups concurrently, it follows that up to G*M thread groups can be executing in GPC 208 at any given time.

Additionally, a plurality of related thread groups may be active (in different phases of execution) at the same time within an SM 310. This collection of thread groups is referred to herein as a "cooperative thread array" ("CTA") or "thread array." The size of a particular CTA is equal to m*k, where k is the number of concurrently executing threads in a thread group, which is typically an integer multiple of the number of execution units within the SM 310, and m is the number of thread groups simultaneously active within the SM 310.

Although not shown in FIG. 3, each SM 310 contains a level one (L1) cache or uses space in a corresponding L1 cache outside of the SM 310 to support, among other things, load and store operations performed by the execution units. Each SM 310 also has access to level two (L2) caches (not shown) that are shared among all GPCs 208 in PPU 202. The L2 caches may be used to transfer data between threads. Finally, SMs 310 also have access to off-chip "global" memory, which may include PP memory 204 and/or system memory 104. It is to be understood that any memory external to PPU 202 may be used as global memory. Additionally, as shown in FIG. 3, a level one-point-five (L1.5) cache 335 may be included within GPC 208 and configured to receive and hold data requested from memory via memory interface 214 by SM 310. Such data may include, without limitation, instructions, uniform data, and constant data. In embodiments having multiple SMs 310 within GPC 208, the SMs 310 may beneficially share common instructions and data cached in L1.5 cache 335.

Each GPC 208 may have an associated memory management unit (MMU) 320 that is configured to map virtual addresses into physical addresses. In various embodiments, MMU 320 may reside either within GPC 208 or within the memory interface 214. The MMU 320 includes a set of page table entries (PTEs) used to map a virtual address to a physical address of a tile or memory page and optionally a cache line index. The MMU 320 may include address translation lookaside buffers (TLB) or caches that may reside within SMs 310, within one or more L1 caches, or within GPC 208.

In graphics and compute applications, GPC 208 may be configured such that each SM 310 is coupled to a texture unit 315 for performing texture mapping operations, such as determining texture sample positions, reading texture data, and filtering texture data.

In operation, each SM 310 transmits a processed task to work distribution crossbar 330 in order to provide the processed task to another GPC 208 for further processing or to store the processed task in an L2 cache (not shown), parallel processing memory 204, or system memory 104 via crossbar unit 210. In addition, a pre-raster operations (preROP) unit 325 is configured to receive data from SM 310, direct data to one or more raster operations (ROP) units within partition units 215, perform optimizations for color blending, organize pixel color data, and perform address translations.

It will be appreciated that the core architecture described herein is illustrative and that variations and modifications are possible. Among other things, any number of processing units, such as SMs 310, texture units 315, or preROP units 325, may be included within GPC 208. Further, as described above in conjunction with FIG. 2, PPU 202 may include any number of GPCs 208 that are configured to be functionally similar to one another so that execution behavior does not depend on which GPC 208 receives a particular processing task. Further, each GPC 208 operates independently of the other GPCs 208 in PPU 202 to execute tasks for one or more application programs. In view of the foregoing, persons of ordinary skill in the art will appreciate that the architecture described in FIGS. 1-3 in no way limits the scope of the present invention.

Predictive Verification of Write Integrity in a Memory Driver

Figure 4:
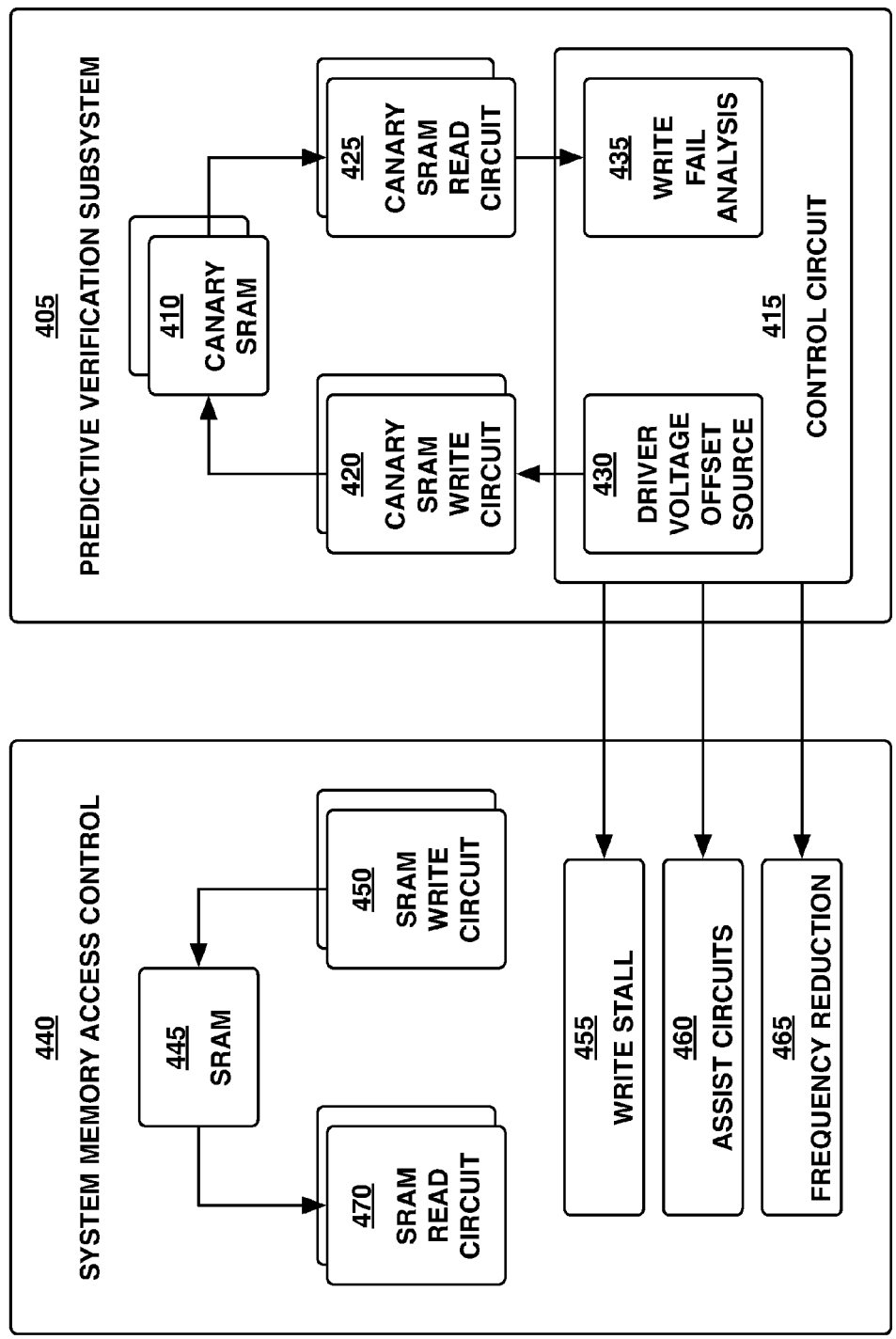
FIG. 4 is a conceptual diagram of a subsystem configured to perform predictive verification of write integrity via a canary SRAM cell, according to one embodiment of the present invention.

FIG. 4 is a conceptual diagram of a predictive verification subsystem 405 configured to predict write integrity of SRAM 445 via a canary SRAM 410, according to one embodiment of the present invention. Predictive verification subsystem 405 may be included within any portion of computer system 100 of FIG. 1 and configured to predict write integrity with respect to any SRAM. For example, predictive verification subsystem 405 could be coupled to PP memory 204 and configured to predict write integrity with respect to the SRAM cells within PP memory 204. As another example, predictive verification subsystem 405 could be coupled to L1.5 cache 335 and configured to predict write integrity with respect to the SRAM cells within L1.5 cache 335. In yet another example, predictive verification subsystem 405 could be coupled to an SRAM included within a system-on-chip (SoC) and configured to predict write integrity with respect to the cells included within that SRAM.

As shown, predictive verification subsystem 405 includes canary SRAM 410, canary SRAM write circuit 420, canary SRAM read circuit 425, and control circuit 415. Control circuit 415 includes driver offset voltage source 430 and write fail analysis 435. Predictive verification subsystem 405 is coupled to a system memory access control 440. System memory access control 440 includes SRAM 445, SRAM write circuit 450, SRAM read circuit 470, write stall 455, assist circuits 460, and frequency reduction 465. SRAM 445 is a memory cell that may be employed within any portion of computer system 100. SRAM write circuit 450 loads digital data into SRAM 445. SRAM read circuit 470 retrieves stored data from SRAM 445 during system operation.

Canary SRAM 410 is a memory cell that is similar in construction to SRAM 445. Canary SRAM 410 may be an element of an operational SRAM macro or may be an independent test cell. Canary SRAM 410 serves to validate the operational integrity of SRAM 445. Data associated with normal system operation is stored in SRAM 445, whereas data associated with a testing procedure is stored in canary SRAM 410. The testing procedure is described in greater detail below. A failure of a write operation to canary SRAM 410 tends to indicate that a failure in SRAM 445 may be more likely. Accordingly, a failure of canary SRAM 410 may indicate a future failure of SRAM 445. To detect a write failure in canary SRAM 410, canary SRAM write circuit 420 overwrites data previously written to canary SRAM 410 to the opposite logic sense in alternating cycles of the testing procedure. Data that is read from canary SRAM 410 should match the previously written test data only when that previous write operation was successful. If the data does not match, then a failure of canary SRAM 410 has occurred, and a failure of SRAM 445 may be imminent. Predictive verification subsystem 405 is also configured to introduce an offset voltage that increases the susceptibility of canary SRAM 410 to write failures in order to predict the likelihood of failures of SRAM 445. When failure is likely, corrective measures may be deployed to avoid such failures.

In operation, canary SRAM write circuit 420 loads test data into SRAM 445. Control circuit 415 directs canary SRAM write circuit 420 to write alternate logic states into canary SRAM 410. Specifically, if canary SRAM write circuit 420 had previously written a zero logic state into canary SRAM 410, control circuit 415 directs canary SRAM write circuit 420 to write a one logic state into SRAM 410. Conversely, if a one logic state had been previously written, control circuit 415 directs canary SRAM write circuit 420 to write a zero logic state into SRAM 410.

SRAM read circuit 470 then retrieves the test data from SRAM 445. Write fail analysis 435 determines if the write operation was successful. Failure of the write operation occurs when SRAM read circuit 470 reads data from canary SRAM 410 that is different from the prior data that canary SRAM write circuit 420 had previously written. Driver voltage offset 430 introduces an offset to canary SRAM write circuit 420 that reduces the overdrive capability of canary SRAM write circuit 420 in an effort to induce a failure of the write operation.

When a write failure occurs, write fail analysis 435 further determines a probability of failure of associated operational cells in SRAM 445. Failures that occur in a time frame of tens of clock cycles are typically related to fluctuations of the supply voltage. Failures that occur in a time frame of thousands of clock cycles are typically related to temperature effects. Finally, failures that occur in a time frame of days or months are typically related to aging effects. Instances of canary SRAM 410 may be distributed across multiple locations in a microcircuit depending on the time frame of potential of failures to be predicted. For example, instances of canary SRAM 410 may be collocated with SRAM 445 in areas vulnerable to voltage fluctuations. As another example, instances of canary SRAM 410 may be collocated with SRAM 445 that are in areas vulnerable to elevated temperatures. As yet another example, a single instance of canary SRAM 410 may be placed at any location to detect failure susceptibility due to process characteristics of the microchip. Write fail analysis 435 may collect statistics from multiple instantiations of canary SRAM 410 cells.

When write fail analysis 435 determines that the probability of failure for an operational memory cell in SRAM 410 is unacceptable (e.g., above a threshold value), control circuit 415 directs deployment of measures to effect corrective action. Depending on the time fame of failures, as described above, various methods of corrective action may be implemented. Write stall 455 may delay write operations in expectation of improvement in system conditions. For example, the voltage may recover to a more tolerable level, or voltage fluctuations may diminish over time. Alternatively, assist circuits 460 may be activated to improve the drive margin either by collapsing the local supply voltage or shifting the bit-line voltage negative. Finally, frequency reduction 465 may be activated to reduce the frequency with which write operations are scheduled, thus reducing the likely voltage fluctuations.

Conceptually, predictive verification subsystem 405 introduces, in canary SRAM 410, perturbations that mimic system degradation in order to anticipate susceptibility to write errors. Predictive verification subsystem 405 gradually increases the severity of the perturbations until write failure occurs in canary SRAM 410. Corrective measures are then initiated prior to the occurrence of any actual write failures. In this manner, embodiments of the present invention ensure error free performance of the memory subsystem while reducing power usage by maintaining assist circuits in a low power, idle condition until needed.

Figure 5:
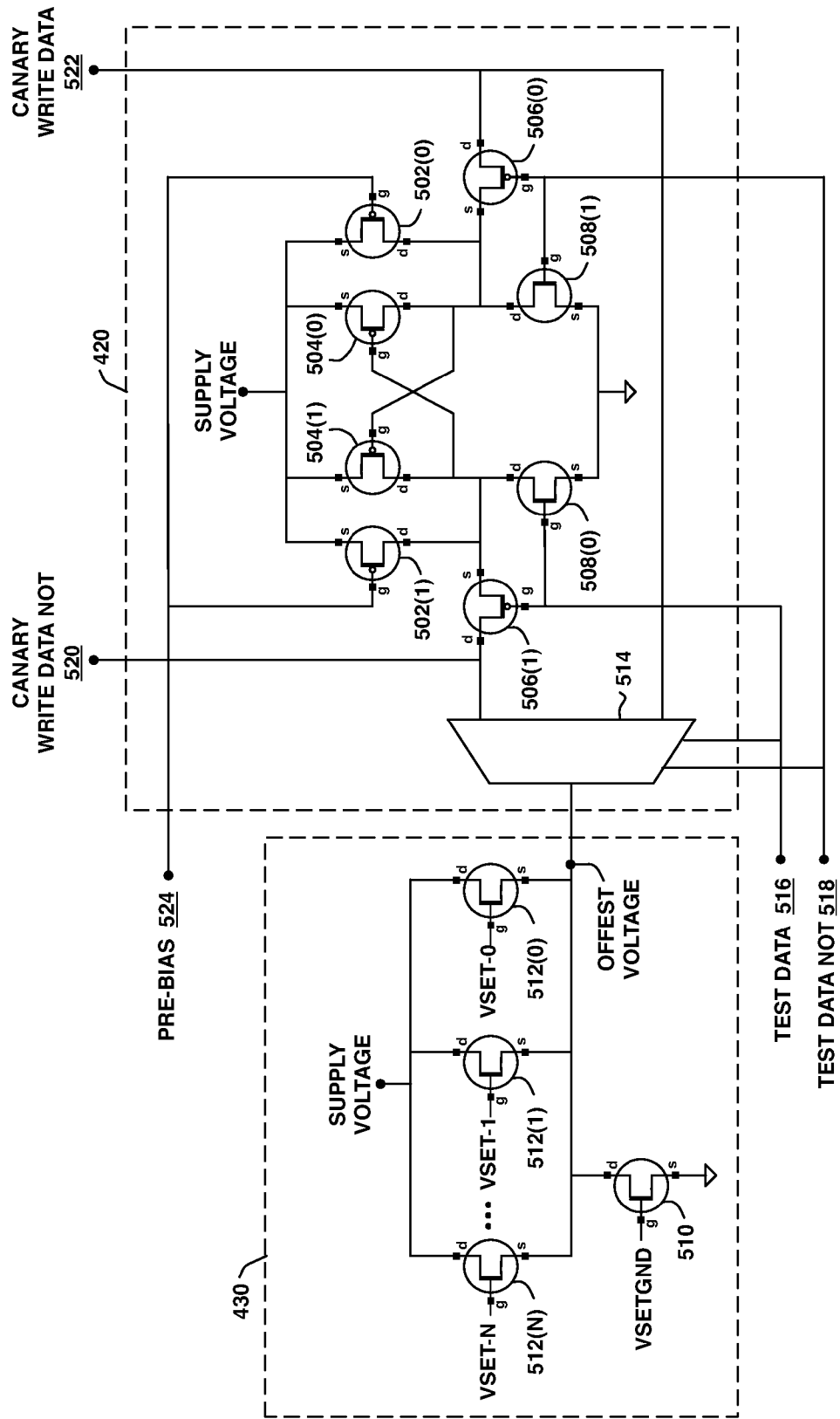
FIG. 5 is a conceptual diagram of a circuit configured to perform a write operation to the canary SRAM cell of FIG. 4, according to one embodiment of the present invention.

FIG. 5 is a conceptual diagram of a circuit configured to perform a write operation to canary SRAM 410 of FIG. 4, according to one embodiment of the present invention. As shown, canary SRAM write circuit 420 may be constructed with multiple FETs. More specifically, PFETs, such as PFET 502, establish a conductive channel from source to drain when the voltage on the gate terminal is below a negative threshold voltage, with respect to the source terminal, and is nonconductive otherwise. NFETs, such as NFET 508, establish a conductive channel from source to drain when the voltage on the gate terminal is above a positive threshold voltage, with respect to the source terminal, and is nonconductive otherwise.

As shown, driver offset voltage source 430 includes NFET 510 and NFETs 512. NFET 512(0) and NFET 510, form a voltage divider when control circuit 415 drives both gates. NFET 512(0) is constructed with larger area than NFET 510 so that the resulting offset voltage is a small fraction of the supply voltage relative to the NFET threshold voltage. When control circuit 415 drives the gate of NFET 512(1), NFET 512(1) conducts, and offset voltage increases to a marginally larger fraction of the supply voltage. Control circuit 415 successively drives the gates of NFET 512(2) through NFET 512(N) to further increment offset voltage.

As further shown, canary SRAM write circuit 420 includes NFETs 508 and 512, PFETs 502, 504, and 506, and multiplexer 514. Canary SRAM write circuit 420 overwrites the previous logic state that had been written to canary SRAM 410. Specifically, if the data in SRAM 410 is a logic level one, canary SRAM write circuit 420 writes a logic zero, and if the data in SRAM 410 is a logic level zero, canary SRAM write circuit 420 writes a logic one. Each successive write operation continues to alternate the logic level in canary SRAM 410, and, in this manner, write fail analysis 435 is able to ascertain the validity of the write operation. The functionality of canary SRAM write circuit 420 is as follows.

In one example of a write operation, test data 516 and test data not 518 are both initially forced to ground, which turns off NFETs 508. Pre-bias 524 is then momentarily forced low, which turns on PFETs 502. Pre-bias 524 is then returned high, test data 516 is forced high and test data not 518 is retained low. The high level of test data 516 driving the gate of NFET 508(0) causes NFET 508(0) to turn on, which, in turn, causes PFET 504(0) to conduct. Further, the low level at test data not 518 retains NFET 508(1) off and causes PFET 506(0) to conduct, which connects the high level provided by PFET 504(0) to canary write data 522. Thus, canary SRAM write circuit 420 drives canary write data 522 to a high level to overwrite the existing low level in SRAM 410.

Further, the high level at the gate of PFET 506(1) forces PFET 506(1) to a non-conducting state, which is effectively open circuit. The high level of test data 516 causes multiplexer 514 to transmit offset voltage to canary write data not 520 while the output of multiplexer 514 to canary write data 522 is open circuit. Thus, canary SRAM write circuit 420 drives canary write data not 520 to a low level that is limited to offset voltage to overwrite the existing high level complement in SRAM 410.

Summarizing this one example of a write operation, a high level of test data 516 in canary SRAM write circuit 420 causes a high level of canary write data 522 while restricting the low level of canary write data not 520 to the voltage that offset voltage source 430 has programmed by activating a number of NFETs 512. Offset voltage source 430 increments the level of offset voltage with each successive write cycle to increase the susceptibility of canary SRAM 410 to failure. When predictive verification subsystem 405 finally induces failure in canary SRAM 410, write fail analysis 435 determines the probability of failure of SRAM 445 based on the level of offset voltage source 430 at which failure occurred.

In a subsequent write iteration in the testing procedure, canary SRAM write circuit 420 programs a low level at canary write data 522 to overwrite the previous high programmed in canary SRAM 410 as described above. Test data 516 and test data not 518 are again initially forced to ground, while pre-bias 524 is momentarily forced low. Pre-bias 524 is then returned high, test data not 518 is forced high, and test data 516 is retained low. The high level of test data not 518 driving the gate of NFET 508(1) causes NFET 508(1) to turn on, which, in turn, causes PFET 504(1) to conduct. Further, the low level at test data 516 retains NFET 508(0) off and causes PFET 506(1) to conduct, which connects the high level provided by PFET 504(1) to canary write data not 520. Thus, canary SRAM write circuit 420 drives canary write data not 520 to a high level to overwrite the existing low level in canary SRAM 410.

Further, the high level at the gate of PFET 506(0) forces PFET 506(0) to a non-conducting state. The high level of test data not 518 causes multiplexer 514 to transmit offset voltage to canary write data 522 while the output of multiplexer 514 to canary write data not 520 is open circuit. Thus, canary SRAM write circuit 420 drives canary write data 522 to a low level that is limited to offset voltage to overwrite the existing high level complement in canary SRAM 410.

Summarizing this subsequent write iteration, a high level test data not 518 in canary SRAM write circuit 420 causes a high level of canary write data not 520 while restricting the low level of canary write data 522 to the voltage that offset voltage source 430 has programmed by activating a number of NFETs 512. Offset voltage source 430 increments the level of offset voltage with each successive write cycle to increase the susceptibility of canary SRAM 410. When predictive verification subsystem 405 finally induces failure in canary SRAM 410, write fail analysis 435 determines probability of failure of SRAM 445.

Proceeding as described above, control circuit 415 alternately transmits ones and zeroes to canary SRAM write circuit 420 to perform test write operations upon canary SRAM 410. In each write cycle, canary SRAM write circuit 420 drives the low voltage component of the complementary data pair to an offset voltage that offset voltage source 430 has programmed by activating a number of NFETs 512. Offset voltage source 430 increments the offset voltage to successively increase the likelihood of the write operation failing. In this manner, control circuit 415 collects statistics that relate to overall system conditions in order to calculate a probability of failure for the next operational system write cycle to SRAM 410.

Persons skilled in the art will understand that a subsystem constructed with any manner of equivalent circuit elements that performs the functionality of the circuits shown in FIG. 5 is within the scope of the present invention.

Figure 6:
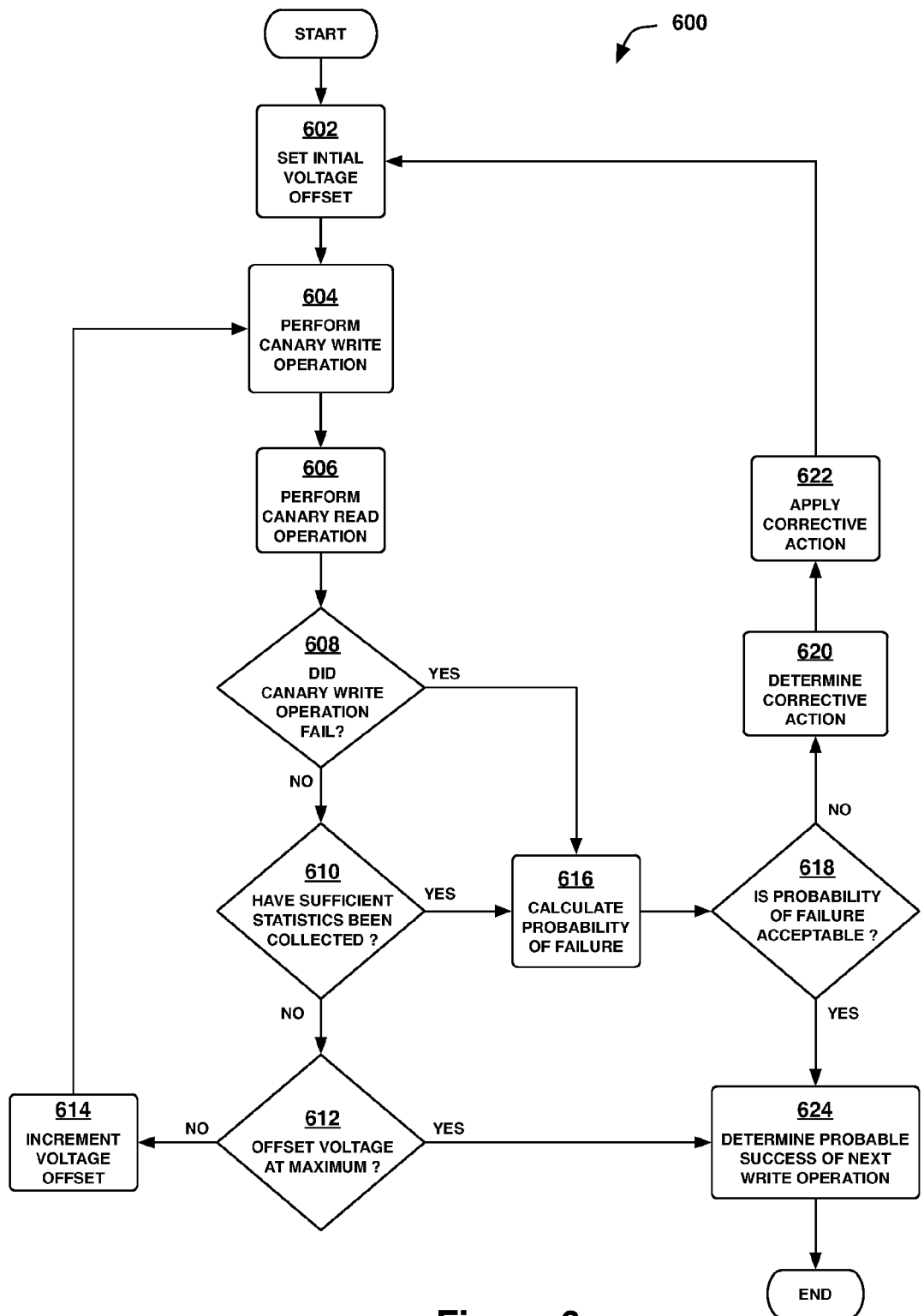
FIG. 6 is a flow diagram of method steps for performing predictive verification of write integrity, according to one embodiment of the present invention.

FIG. 6 is a flow diagram of method steps for performing predictive verification of write integrity in a memory driver, according to one embodiment of the present invention. Although the method steps are described in conjunction with the systems of FIG. 1-5, persons skilled in the art will understand that any system configured to perform the method steps, in any order, is within the scope of the present invention.

As shown, a method 600 begins at step 602, where driver offset voltage source 430 sets the initial offset voltage by activating NFET 510 and NFET 512(0). The method 600 then proceeds to step 604. At step 604, canary SRAM write circuit 420 performs a write operation to change the logic state of the data stored in canary SRAM 410. The method 600 then proceeds the step 606. At step 606, canary SRAM read circuit 430 performs a read operation. The method 600 then proceeds to step 608. At step 608, write fail analysis 435 determines if the data stored in canary SRAM 410 is the same as the data that canary SRAM write circuit 420 wrote at step 604.

If, at step 608, write fail analysis 435 determines that the data stored in canary SRAM 410 is the same as the data that canary SRAM write circuit 420 wrote at step 604, the method 600 proceeds to step 616. If, at step 608, write fail analysis 435 determines that the data stored in canary SRAM 410 is the not same as the data that canary SRAM write circuit 420 wrote at step 604, a write failure has occurred. The method 600 then proceeds to step 610.

At step 610, write fail analysis 435 determines if sufficient statistics have been collected to derive a probability of failure for the next write operation in SRAM 445. If, at step 610, write fail analysis 435 determines that sufficient statistics have been collected to derive a probability of failure for the next write operation in SRAM 445, the method 600 proceeds to step 616. If, at step 610, write fail analysis 435 determines that insufficient statistics have been collected to derive a probability of failure for the next write operation in an operational memory cell in SRAM 445, the method 600 proceeds to step 612.

At step 612, write fail analysis 435 determines if the offset voltage is set to the maximum level within the adjustment range. If, at step 612, write fail analysis 435 determines that the offset voltage is not set to the maximum level within the adjustment range, the method 600 proceeds to step 614. At step 614, driver voltage offset 430 increments the offset voltage by activating the next successive NFET among NFETs 512, that is, if the last activated NFET among NFETs 512, was NFET 512(n), then voltage offset 430 activates NFET 512(n+1). Driver offset voltage source 430 then returns to step 604 where canary SRAM write circuit 420 performs a write operation as part of a subsequent iteration of the testing procedure. If, at step 612, write fail analysis 435 determines that the offset voltage is set to the maximum level within the adjustment range, the method 600 proceeds to step 624. At step 624, write fail analysis 435 determines the probable success of the next write operation.

Returning, now, to step 616, write fail analysis 435 calculates the probability of failure for the next write operation to SRAM 410. The method 600 then proceeds to step 618 where write fail analysis determines if the probability of failure is at an acceptable level. If, at step 618, write fail analysis 435 determines that the probability of failure for the next write operation to SRAM 410 is at an acceptable level, the method 600 proceeds to step 624. At step 624, write fail analysis 435 determines the probable success of the next write operation. If, at step 618, write fail analysis 435 determines that the probability of failure for the next write operation to SRAM 410 is not at an acceptable level, the method 600 proceeds to step 620.

At step 620, control circuit 415 determines the appropriate corrective action among write stall 455, assist circuits 460, and frequency reduction 465. The method 600 then proceeds to step 622. At step 622, system memory access control 440 applies the selected corrective action among write stall 455, assist circuits 460, and frequency reduction 465. The method 600 then proceeds to step 602 where driver offset voltage source 430 sets the initial offset voltage by activating NFET 510 and NFET 512(0) as part of a subsequent iteration of the testing procedure.

In sum, a subsystem is configured to apply an offset voltage to a test, or canary, SRAM write driver circuit to create a condition that induces failure of the write operation. The offset voltage is incrementally increased until failure of the test write operation occurs in the canary SRAM circuit. The subsystem then calculates a probability of failure for the actual, non-test SRAM write operation, which is performed by an equivalent driver circuit with zero offset. The subsystem then compares the result to a benchmark acceptable probability figure. If the calculated probability of failure is greater than the benchmark acceptable probability figure, corrective action is initiated. In this manner, actual failures of SRAM write operations are anticipated, and corrective action reduces their occurrence and their impact on system performance.

One advantage of the subsystems disclosed herein is that the predictive verification subsystem may anticipate when memory access failures are likely to occur and then initiate corrective action before actual failures occur. Further, the predictive verification subsystem is configured to gate off assist circuits when assist circuit utility is not required, thereby reducing power usage.

The invention has been described above with reference to specific embodiments. Persons of ordinary skill in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

Therefore, the scope of embodiments of the present invention is set forth in the claims that follow.

The invention claimed is:

1. A computer-implemented method for predicting failures in a plurality of memory cells, the method comprising:
 performing a first write operation to write first data to a first memory cell;
 determining that the first write operation has failed;
 in response to determining that the first write operation has failed, computing a first failure probability associated with a second memory cell based on a first voltage offset;
 determining that the first failure probability exceeds a threshold value; and
 applying a corrective action to the second memory cell.

2. The computer-implemented method of claim 1, wherein determining that the write operation has failed comprises:
 performing a first read operation to read data from the first memory cell; and
 determining that the data read during the first read operation is different than the first data written during the first write operation.

3. The computer-implemented method of claim 1, wherein applying the corrective action comprises temporarily stalling one or more write operations issued to the second memory cell.

4. The computer-implemented method of claim 1, wherein applying the corrective action comprises activating an assist circuit that is configured to increase or decrease a voltage offset associated with the second memory cell.

5. The computer-implemented method of claim 1, wherein applying the corrective action comprises reducing a frequency at which the second memory cell services write operations.

6. The computer-implemented method of claim 1, further comprising:
 performing a second write operation to write second data to the first memory cell;
 determining that the second write operation has completed successfully; and
 decreasing the first voltage offset to a second voltage offset to increase the susceptibility of the first memory cell to write operation failures.

7. The computer-implemented method of claim 6, further comprising:
 performing a third write operation to write third data to the first memory cell;
 determining that the third write operation has failed;
 computing a second failure probability associated with the second memory cell based on the third voltage offset;
 determining that the second failure probability exceeds the threshold value; and
 applying another corrective action to the second memory cell.

8. The computer-implemented method of claim 1, wherein the first memory cell and the second memory cell comprise static random access memory cells.

9. A subsystem configured to predict failures in a plurality of memory cells, comprising:
 a write circuit configured to write first data to a first memory cell;
 a read circuit configured to read second data from the first memory cell;
 a control circuit configured to:

identify that the first data is different from the second data, in response to identifying that the first data is different from the second data, determine that a corrective action should be applied to a second memory cell that is associated with the first memory cell, and apply a corrective action to the second memory cell.

10. The subsystem of claim 9, wherein the control circuit is configured to identify that the first write operation failed by determining that the second data is different than the first data.

11. The subsystem of claim 9, wherein the control circuit is further configured to initialize the first memory cell with a first voltage offset prior to the write circuit writing the first data to the first memory cell.

12. The subsystem of claim 11, wherein the control circuit determines that the corrective action should be applied to the second memory cell by:

computing a first failure probability associated with the second memory cell based on the first voltage offset; and determining that the first failure probability exceeds a threshold value.

13. The subsystem of claim 9, wherein the control circuit applies the corrective action by temporarily stalling one or more write operations issued to the second memory cell.

14. The subsystem of claim 9, wherein the control circuit applies the corrective action by activating an assist circuit that is configured to increase or decrease a voltage offset associated with the second memory cell.

15. The subsystem of claim 9, wherein the control circuit applies the corrective action by reducing a frequency at which the second memory cell services write operations.

16. The subsystem of claim 9, wherein the write circuit is further configured to perform a second write operation to write second data to the first memory cell, and wherein the control circuit is further configured to:

determine that the second write operation has completed successfully; and decrease the first voltage offset to a second voltage offset to increase the susceptibility of the first memory cell to write operation failures.

17. The subsystem of claim 16, wherein the write circuit is further configured to performing a third write operation to write third data to the first memory cell, and wherein the control circuit is further configured to:

determine that the third write operation has failed;

compute a second failure probability associated with the second memory cell based on the third voltage offset;

determine that the second failure probability exceeds the threshold value; and apply another corrective action to the second memory cell.

18. The subsystem of claim 9, wherein the first memory cell and the second memory cell comprise static random access memory cells.

19. A computing device configured to predict failures in a plurality of memory cells, including:

a first memory cell;

a second memory cell; and a predictive verification subsystem that:

perform a first write operation to write first data to the first memory cell, determine that the first write operation has failed, in response to determining that the first write operation has failed, compute a first failure probability associated with the second memory cell, determine that the first failure probability exceeds a threshold value, and apply a corrective action to the second memory cell.

20. The computing device of claim 19, wherein the first memory cell and the second memory cell comprise static random access memory cells.

* * * * *